(12) United States Patent
Vogelsang et al.

(10) Patent No.: US 8,908,454 B2
(45) Date of Patent: Dec. 9, 2014

(54) MEMORY ARCHITECTURE WITH REDUNDANT RESOURCES

(75) Inventors: Thomas Vogelsang, Mountain View, CA (US); Brent Steven Haukness, Monte Sereno, CA (US)

(73) Assignee: Rambus Inc., Sunnyvale, CA (US)

( * ) Notice: Subject to any disclaimer, the term of this patent is extended or adjusted under 35 U.S.C. 154(b) by 58 days.

(21) Appl. No.: 13/589,409

(22) Filed: Aug. 20, 2012

(65) Prior Publication Data

US 2012/0314520 A1    Dec. 13, 2012

Related U.S. Application Data

(63) Continuation of application No. PCT/US2011/025487, filed on Feb. 18, 2011.

(60) Provisional application No. 61/307,105, filed on Feb. 23, 2010.

(51) Int. Cl.
*G11C 29/00* (2006.01)
*G11C 8/14* (2006.01)
*G11C 11/4097* (2006.01)

(52) U.S. Cl.
CPC ...... *G11C 11/4097* (2013.01); *G11C 2207/002* (2013.01); *G11C 29/848* (2013.01); *G11C 8/14* (2013.01)
USPC ...................... 365/200; 365/230.02

(58) Field of Classification Search
USPC ............... 365/200, 230.02, 230.06, 189.02
See application file for complete search history.

(56) References Cited

U.S. PATENT DOCUMENTS

| | | | |
|---|---|---|---|
| 5,396,124 A * | 3/1995 | Sawada et al. | 326/13 |
| 5,822,268 A | 10/1998 | Kirihata | 365/230.03 |
| 6,333,889 B1 | 12/2001 | Arimoto | 365/230.03 |
| 6,426,901 B2 | 7/2002 | Wada | 365/200 |
| 6,646,946 B2 | 11/2003 | Tomishima et al. | 365/230.03 |
| 7,095,666 B2 | 8/2006 | Foss | 365/207 |
| 7,515,501 B2 | 4/2009 | Bessho et al. | 365/230.03 |
| 2002/0061606 A1 * | 5/2002 | Honma et al. | 438/14 |
| 2008/0253159 A1 | 10/2008 | Kajigaya | 365/51 |

(Continued)

OTHER PUBLICATIONS

Nitta, Yasuhiko, et al., "SP23.5: A 1.6GB/s Data-Rate 1Gb Synchronous DRAM with Hierarchical Square-Shaped Memory Block & Distributed Bank Architecture", IEEE ISSCC Digest of Technical Papers, p. 376-377, 477, Feb. 10, 1996.

(Continued)

*Primary Examiner* — Vu Le
(74) *Attorney, Agent, or Firm* — Silicon Edge Law Group LLP; Arthur J. Behiel

(57) ABSTRACT

A hierarchical memory architecture includes an array of memory sub-arrays, each of which includes an array of memory cells. Each sub-array is supported by local wordlines, local column-select lines, and bitlines. The local wordlines are controlled using main wordlines that extend past multiple sub-arrays in a direction parallel to a first axis, whereas the local column-select lines are controlled using main column-select lines that extend between sub-arrays in a direction perpendicular to the first axis. At the direction of signals presented on the local wordlines and column-select lines, subsets of the bitlines in each sub-array are connected to main data lines that extend over a plurality of the sub-arrays in parallel with the second axis. Some embodiments include redundant data resources that are selected based on a decoding of row addresses.

26 Claims, 11 Drawing Sheets

(56) References Cited

U.S. PATENT DOCUMENTS

2009/0180339 A1 7/2009 Kim et al. .................... 365/200
2010/0005376 A1 1/2010 La Berge et al. ............. 714/819
2010/0060310 A1 3/2010 Laisne et al. ................... 326/10

OTHER PUBLICATIONS

Kang et al., "8Gb 3D DDR3 DRAM Using Through-Silicon-Via Technology," ISSCC 2009, Session7, 2009 IEEE International Solid-State Circuits Conference, pp. 130-132, Feb. 10, 2009. 3 pages.

PCT Search Report and Written Opinion dated Nov. 9, 2011 re Int'l. Application No. PCT/US2011/025487. 10 Pages.

International Preliminary Report on Patentability (Chapter I) dated Sep. 7, 2012 in International Application No. PCT/US11/025487. 7 pages.

Jacob, Bruce et al., "DRAM Circuit and Architecture Basics", DRAM Memory System: Lecture 2, Spring 2003, University of Maryland. 32 slides.

Watanabe, Y. et al., "A 286mm2 256Mb DRAM with X32 Both-Ends DQ", Toshiba, IBM, Siemens at IBM Semiconductor Research and Development Center, Hopewell Junction, NY 12533 USA, 1995 Symposium on VLSI circuits Digest of Technical Papers, pp. 105-106. 2 pages.

Kang et al., "8Gb 3D DDR3 DRAM Using Through-Silicon-Via Technology", 2009 IEEE International Solid-State Circuits Conference. 20 Slides.

* cited by examiner

MEMORY ARCHITECTURE WITH REDUNDANT RESOURCES

FIELD

The subject matter disclosed herein relates generally to the field of computer memory, and more particularly to memory architectures.

BACKGROUND

Manufacturers and designers of integrated circuit (IC) devices, such as memory controllers or processors, continue to increase the amount of signals that these devices can transmit and/or receive over a period of time (bandwidth). For example, processors having multiple cores have enabled, at least in part, increased processor bandwidth that may be used in communicating with IC memory devices.

Conventional memory devices will have difficulty increasing their bandwidths to meet the ever increasing demand. For example, dynamic random access memory (DRAM) arrays are scaling to provide more storage, but the speed of memory-cell access is remaining fairly constant due to physical constraints on the structures used to store and retrieve data. Memory bandwidth can be increased by accessing more data bits in parallel, but doing so in conventional memory architectures dramatically increases power use and area requirements. There is therefore a need for memory architectures, circuits, and methods that increase memory bandwidth without undue increases in power consumption, area, or circuit complexity.

Conventional memory devices, including DRAMs, include redundant columns of memory cells and related repair circuitry to compensate for defective memory resources (e.g., defective memory cells). The repair circuitry typically disables a column associated with defect memory resources and substitutes the disabled column with a redundant column provided for this purpose. Substituting a defective column takes time, however, and can therefore increase the time required to access the memory. There is therefore a need for improved methods and circuits for substituting defective memory resources.

BRIEF DESCRIPTION OF THE DRAWINGS

The subject matter disclosed is illustrated by way of example, and not by way of limitation, in the figures of the accompanying drawings and in which like reference numerals refer to similar elements and in which.

DETAILED DESCRIPTION

Figure 1:
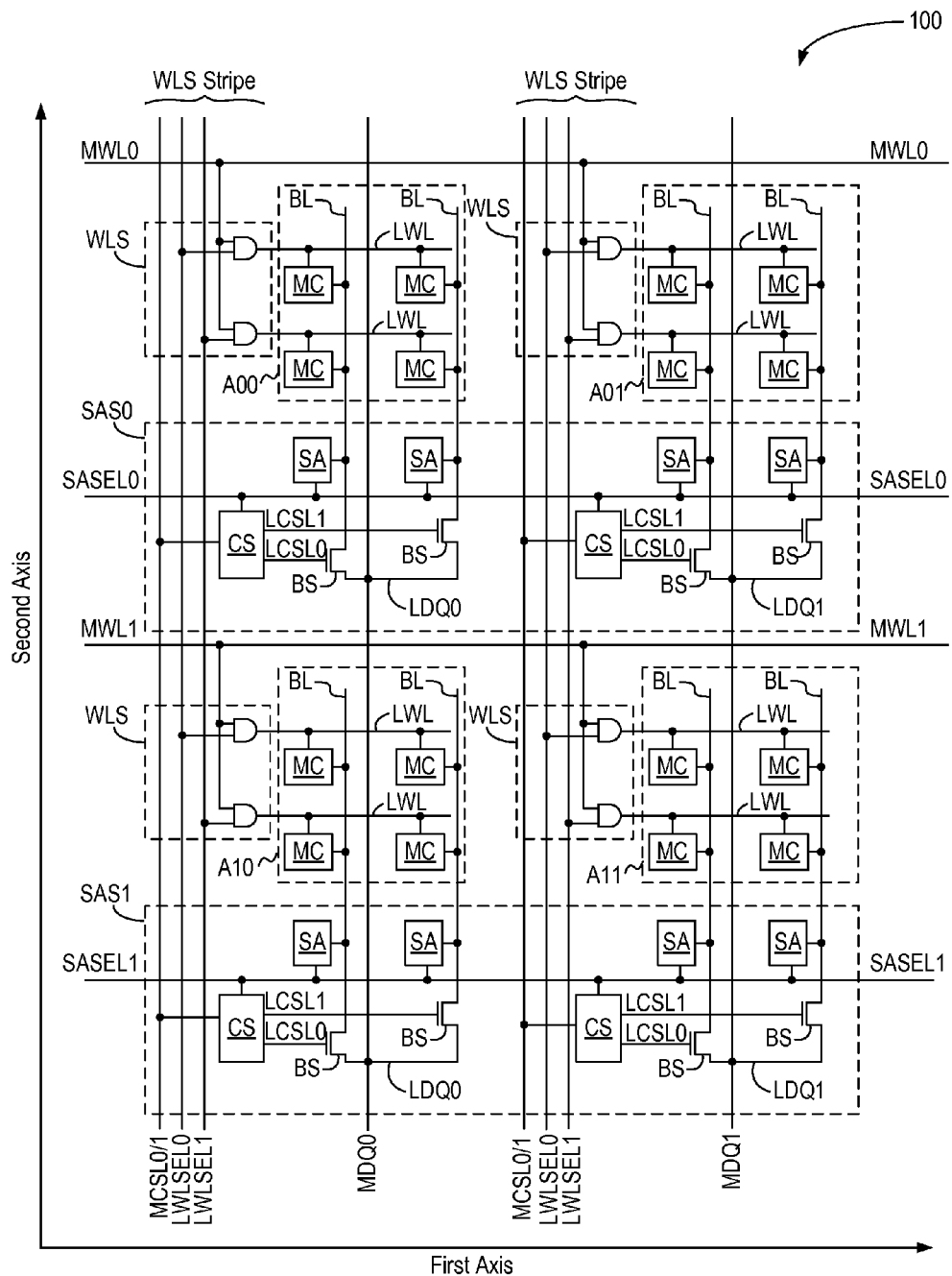
FIG. 1 depicts a portion of an integrated-circuit (IC) DRAM device 100 upon which is instantiated a hierarchical memory array in accordance with one embodiment.

FIG. 1 depicts a portion of an integrated-circuit (IC) DRAM device 100 upon which is instantiated a hierarchical memory array in accordance with one embodiment. The memory array is a two-dimensional array of four memory sub-arrays A00, A01, A10, and A11 arranged along perpendicular first and second axes, respectively horizontal and vertical in FIG. 1. Each sub-array includes an array of "1T" DRAM cells MC arranged in rows and columns, though other types of memory cells might also be used. Sub-arrays are accessed in pairs in this embodiment, with each sub-array opening a row of two memory cells MC.

It should be appreciated that rows and columns may be of various sizes, depending on implementation. In the following examples and in the Figures, this document will focus on a specific piece of an array with a page size that has four memory bits, and supports write and read of a data width of two bits (that is, where only two cells are actually read out of a sub-array or written to). In this regard, "row" refers to the number of memory cells in a sub-array row, "page" refers to the number of memory cells having a common row address across multiple sub-arrays, and "data width" refers to the number of bits communicated for a given memory access. FIG. 1 is thus greatly simplified for ease of illustration. Practical memory devices include far more sub-arrays, and far more memory cells per sub-array than the row size of 4 and data width of 2 discussed in these examples.

The power and time required for data access increases with increasing page size. Increasing data width for a given page size, or reducing page size for a given data width, therefore increases the speed and reduces the power required to access a given quantity of data. To this end, DRAM device 100 supports dramatically greater data widths for a given row size than conventional hierarchical DRAM devices.

One reason for the dramatic increase in data-width relative to page size for device 100 is the relative placement of the main data lines MDQ0 and MDQ1 vs. the main column-select lines MCSL0/1. In conventional hierarchical DRAM devices, the main data lines extend between the memory sub-arrays and the main column-select lines extend over the memory sub-arrays. In the embodiment of FIG. 1, however, the main data lines MDQ0 and MDQ1 extend over the memory sub-arrays A00, A01, A10, and A11 and the main column-select lines MCSL0/1 extend over the relatively narrow space between them. In general, the memory sub-arrays are considerably wider than the space that separates them, so routing the main data lines over the sub-arrays permits more main data lines, and consequently greater data widths for a given page size.

With reference to the upper left sub-array A00, each row of memory cells MC is coupled to wordline select logic WLS via a common local wordline LWL, and each column of memory cells is connected to a corresponding sense amplifier SA via a respective bitline BL. To read a given memory cell in sub-array A00, device 100 activates both memory cells MC in the selected row using the corresponding local wordline LWL, and thus presents the contents of the row of memory cells to the corresponding pair of sense amplifiers. The sense amplifiers SA sense the row of data, and the content of the one sense amplifier SA associated with the selected column is then read.

Sensing a memory DRAM memory cell MC destroys its contents, so the information in both sense amplifiers SA associated with sub-array A00 is written back to the active row. Accessing a memory cell MC in a selected column thus requires activation, sensing, and writing an entire row of memory cells. An entire row is activated and sensed before a column within the sub-array is accessed, and the entire row is overwritten or refreshed before it can be closed in preparation for a subsequent access.

The memory architecture of FIG. 1 includes "local" resources restricted to individual sub-arrays and "main" resources shared among multiple sub-arrays. The local resources include local wordlines LWL, wordline-select logic WLS, bitlines BL, and memory cells MC. The main resources include main wordlines MWL[1,0], main data lines MDQ[1,0], and sense-amplifier select lines SASEL[1,0]. Main wordlines MWL[1,0] and select lines SASEL[1,0] extend past multiple sub-arrays in a direction parallel to the first axis. Main data lines MDQ[1,0] likewise extend past multiple sub-arrays, but in a direction parallel to the second axis and to bitlines BL. The local wordlines in each sub-array are controlled using a single main wordline in this simple illustrative embodiment; however, the sub-arrays in practical memory devices include sets of local wordlines, each set controlled using a respective main wordline. The wordline-select logic WLS associated with the memory arrays are arranged in "stripes" that run parallel to the second axis. Main column select lines MCSL0/1 and local wordline-select lines LWLSEL[1:0] extend over and in parallel with the two WLS stripes in this embodiment. Wordline select logic WLS and bit-select logic BS in sense-amplifier stripes SAS0 and SAS1 logically combine wordline and column-select signals, as detailed below, to reduce the requisite number of column-select lines MCSL0/1, and consequently allow column-select routing in the relatively narrow spaces between the memory sub-arrays. The like-named signals applied to both WLS stripes are identical.

The bitlines BL in each sub-array extend to one of two sense-amplifier stripes SAS0 and SAS1, each of which includes sense amplifiers SA, column-select logic CS, and bit-select logic BS. Local data lines LDQ[3:0] extend between respective main data lines MDQ[1,0] and bit select logic BS. The sense amplifiers SA in each of stripes SAS0 and SAS1 are coupled to a respective one of two sense-amplifier select lines SASEL0 and SASEL1 to receive a corresponding select signal that enables the sense amplifiers when opening a row of memory cells. (As with other designations herein, the designations SASEL0 and SASEL1 refer both to nodes and their corresponding signals; whether a given designation refers to a node or a signal will be clear in context.)

The following discussion focuses on sense-amplifier stripe SAS0 and associated memory sub-arrays A00 and A01. Two sets of wordline select logic WLS selectively connect main wordline MWL0 to one local wordline LWL in each sub-array A00 and A01 if one of two local wordline select signals LWLSEL0 and LWLSEL1 is asserted. (Signals LWLSEL0 and LWLSEL1 select signals local to sub-arrays, but are not themselves local to a sub-array as the term "local" is used herein.) For example, asserting both main wordline signal MWL0 and select signal LWLSEL0 to both sub-arrays A00 and A01 opens the uppermost page of four memory cells MC, a row of two from each of sub-arrays A00 and A01. Sense amplifiers SA in stripe SAS0 sense and amplify the data stored in the open page. In this example, each of four sense amplifiers SA in stripe SAS0 stores a corresponding bit from an open memory cell MC.

Each sub-array is divided into left and right columns of memory cells, each of which is associated with a corresponding bitline BL. Column-select logic CS, responsive to a main column-select signal MCSL0/1, selectively asserts either local column-select signal LCSL0 or LCSL1 to select the left or right columns, respectively. Bit-select logic BS, simple transistor switches in the depicted embodiment, responds to asserted local column-select signals by coupling respective bitlines to main data lines. For example, asserting signals LCSL0 in sense-amplifier stripe SAS0 connects the leftmost bitlines of sub-arrays A00 and A01 to main data lines MDQ0 and MDQ1, respectively.

The main data lines can extend over sense amplifiers SA, from a perspective perpendicular to the first and second axes (normal to the rows and columns of memory cells), for routing efficiency. From a layout perspective, each column-select logic CS can be part of a WLS stripe, a sense-amplifier stripe, or both. The memory sub-arrays in the example of FIG. 1 are depicted as relatively small for ease of illustration; in practical embodiments, the sub-arrays are much larger relative to other device features. For example, the dimension of the memory sub-arrays along the first axis will generally be far greater than that of the WLS stripe. Routing all or most of the main data lines over the memory sub-arrays, rather than over the narrower WLS stripes, provides far greater routing areas for the main data lines and thus supports greater data widths for a given page size. As mentioned previously, increasing data width for a given page size, or reducing page size for a given data width, advantageously increases the speed and reduces the power required to access a given quantity of data.

The simplicity of the illustration of FIG. 1 clarifies several features of the depicted embodiment. Briefly, the arrangement of the data and column select lines, along with modifications to the sense amplifier stripes, allow the memory device to access relatively wider data from each sub-array than can be efficiently accessed using conventional hierarchical memory architectures. Extracting more data for each row access improves power efficiency, increases data bandwidth, or both. These advantages and means for obtaining them are detailed below in connection with other more practical embodiments.

Figure 2:
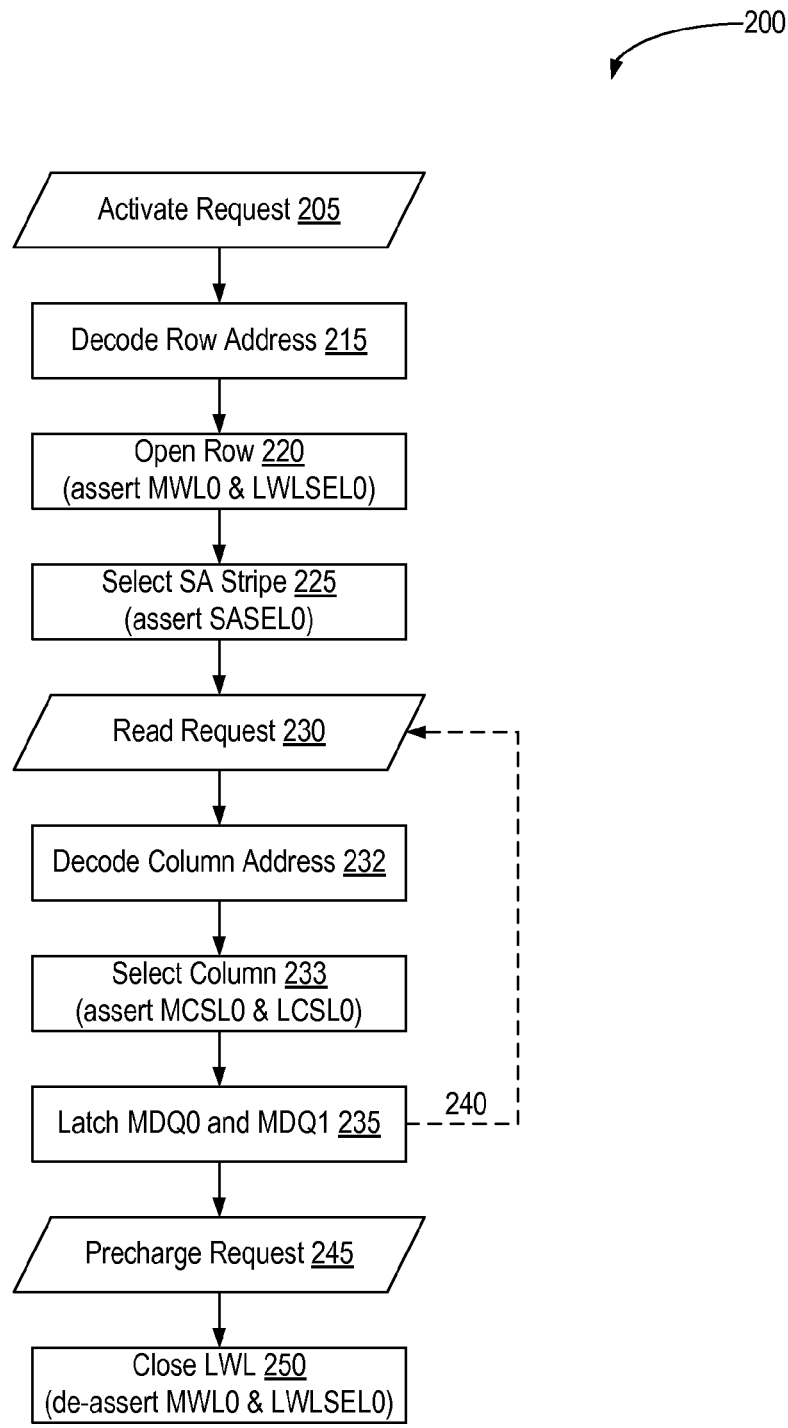
FIG. 2 is a flowchart 200 depicting the operation of IC memory device 100 of FIG. 1 in accordance with one embodiment.

FIG. 2 is a flowchart 200 depicting the operation of IC memory device 100 of FIG. 1 in accordance with one embodiment. This example details a read operation by which row and column accesses are used to deliver the contents of the upper-left memory cells of the upper sub-arrays A00 and A01 to respective main data lines MDQ0 and MDQ1 via sense-amplifier stripe SAS0.

Beginning with step 205, device 100 receives an activate request from an external source (not shown), such as a memory controller. The activate request includes a row address, which is decoded at step 215 to activate the specified row. In this embodiment, a row address specifies a page that spans two sub-arrays, sub-arrays A00 and A01 in this example. Next, the main and local wordline select signals MWL0 and LWLSEL0 are asserted, causing wordline select logic WLS associated with sub-arrays A00 and A01 to assert the signals on their respective uppermost local wordlines LWL, opening a page of memory cells (step 220). Opening a page of memory cells presents the contents of the four uppermost memory cells MC onto their corresponding bitlines BL to be amplified by the four sense amplifiers SA in stripe SAS0, which are activated by assertion of select signal SASEL0 (step 225).

Recalling that the upper-left memory cells MC in each of sub-arrays A00 and A01 are to be read in this example, device 100 next receives a read request 230, from the memory controller, for example, that includes the address of the column to be read. An address decoder (not shown) decodes the column address at step 232 and directs column select blocks CS in stripe SAS0 to assert local column select signals LCS0. The bit-select logic BS associated with the asserted signals connects the leftmost bitlines BL in each sub-array A00 and A01 to respective main data lines MDQ0 and MDQ1 (step 233). The sensed data from the addressed memory cells is therefore made available on the two main data lines.

The data made available on the main data lines can be latched by some output circuitry (not shown) for delivery to whatever entity issued the read request (step 235). For example, the latched data can be serialized with or without data from other arrays (not shown) and conveyed to a requesting memory controller. A dashed arrow 240 indicates that subsequent read or write requests to the open rows, or page, can bypass the row-activation steps to save time and power. In step 250, device 100 closes the open page responsive to a precharge request 245 by de-asserting the main wordline and local wordline select signals MWL0 and LWLSEL to close the local wordlines opened in step 220, after which the bitlines are precharged to a known level in anticipation of the next access.

A write operation is similar to a read operation, except that the data values on the main wordlines are over-written with voltage levels representative of the data to be stored in the addressed memory cells. Refresh operations are also similar, but do not require the assertion of a column-select signal. Circuitry for conveying sensed data to external devices, writing external data to memory devices, and refreshing dynamic memory cells is well known to those of skill in the art, and so is omitted here for brevity.

Figure 3:
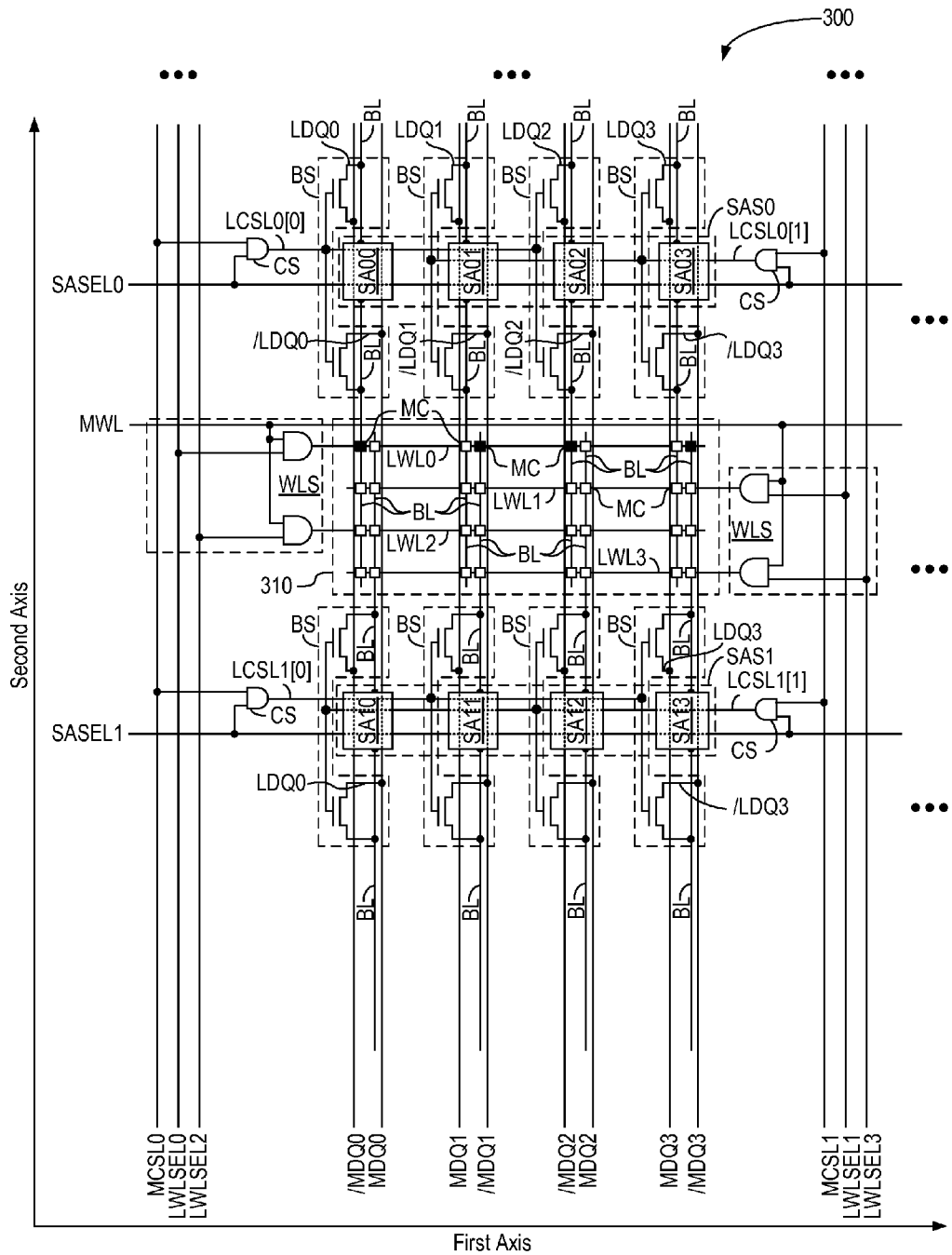
FIG. 3 depicts a portion of a hierarchical memory array 300 in accordance with another embodiment.

FIG. 3 depicts a portion of a hierarchical memory array 300 in accordance with another embodiment. FIG. 3 depicts only one memory sub-array 310 and two adjacent sense-amplifier stripes SAS0 and SAS1. The upper sense-amplifier stripe includes sense amplifiers SA00, SA01, SA02, and SA03; the lower includes sense amplifiers SA10, SA11, SA12, and SA13. Each sense amplifier stripe includes complementary sets of bitlines, one set that extends into the sub-array 310 and another that extends in the direction opposite sub-array 310. With reference to the lower stripe, for example, one set of bitlines BL extends upward into sub-array 310 and the other set of bitlines BL extends downward and away from sub-array 310. The sets of bitlines BL that extend away from sub-array 310 can extend into an adjacent sub-array (not shown) or can be dummy bitlines provided as reference elements in support of differential sensing. Data is delivered to and from sub-array 310 via complementary pairs of main data lines MDQ (e.g., MDQ0 and /MDQ0, where the "/" indicates an active-low signal).

Sub-array 310 includes rows and columns of memory cells MC, each depicted as a small square for ease of illustration. Four darkened squares in the uppermost row represent a subset being accessed as described below. Sub-array 310 additionally includes four local wordlines LWL[3:0] extending perpendicular to the columns of memory cells and the aforementioned bitlines BL extending perpendicular to the rows. Memory sub-arrays are sometimes referred to as memory blocks or mats by those of skill in the art. Sub-array 310 and supporting circuitry are greatly simplified for ease of illustration; a more practical embodiment is detailed below in connection with FIGS. 4 and 5.

The upper sense-amplifier stripe SAS0 includes four sense amplifiers SA00, SA01, SA02, and SA03, a bit switch BS for each sense amplifier, and a multitude of complementary pairs of local data lines LDQ[3:0]/LDQ[3:0]. Each segment of local data line extends perpendicularly from one of the main data lines MDQ[3:0]/MDQ[3:0], and is named to indicate this relationship (e.g., LDQ0 in each sense amplifier stripe extends from main data line MDQ0).

Though FIG. 3 is not to scale, the relative placement and orientations of the main signal paths with respect to the sub-arrays and the sense-amplifier stripes are as they would be instantiated in silicon in this embodiment. For example, the local data lines LDQ0, LDQ1, LDQ2, and LDQ3 in a given sense-amplifier stripe may be collinear conductive segments that extend perpendicularly from respective main data lines, and are shorter than the local wordlines. Collinear conductive segments are formed, for example, in the same metal layer and extend along the same line. The local and main data lines are interconnected directly, rather than by way of a switching element. Interconnections between the local and main data lines may be formed using vias that extend between metal layers (each dot at the junction of horizontal and vertical conductors can represent such a via). The upper stripe additionally includes column-select logic CS on either side supporting a pair of local column select lines LCSL0[0] and LCSL1[1]. Most or all of the local column select lines can be routed over the sense amplifiers, from a perspective perpendicular to the two axes, for routing efficiency.

The lower sense-amplifier stripe SAS1 runs parallel to the first axis and includes four sense amplifiers SA10, SA11, SA12, and SA13, which are identical to the sense amplifiers of the other stripe SAS0 but are named differently to facilitate the following discussion. The remaining elements are the same or similar to like-named structures introduced previously in connection with FIG. 3, so a detailed discussion is omitted.

Sense amplifier stripes SAS0 and SAS1 divide sub-array 310 into two overlapping four-bit-wide columns to produce four-bit-wide data (four complementary data pairs). The operation of memory array 300 is described in the context of a read access to the four darkened memory cells MC associated with local wordline LWL0.

Wordline select logic WLS opens local wordline LWL0 (asserts signal LWL0) when main wordline MWL and local wordline select signal LWLSEL0 are both asserted. The contents of each memory cell MC in the uppermost row of memory cells in sub-array 310 is thus presented to a respective one of the eight sense amplifiers of stripes SAS0 and SAS1 via a respective bitline BL. Wordline select logic WLS may include level shifting circuitry so that the local wordlines are at high enough voltages to allow full restore of data from the sense amplifiers into the memory cells.

The sense amplifiers of the upper and lower stripes SAS0 and SAS1 are selected (enabled) by respective select signals SASEL0 and SASEL1 to allow the sense amplifiers to sense and amplify the voltages presented on the bitlines. Each sense amplifier is also coupled to a complementary second bitline that serves as a reference. The sense amplifiers, the connections between the sense amplifiers and select signals SASEL0 and SASEL1, and the components of sub-array 310 are conventional, so a detailed discussion of these elements is omitted.

A conventional column decoder (not shown) generates main column-select signals MCSL0 and MCSL1 from column address information received with a read or write request. Main column select lines MCSL0 and MCSL1 run parallel to the main data lines and are used to select between the two available four-bit columns of data. In the instant example, select signal MCSL0 is asserted while the sense amplifiers are sensing the bitline voltages responsive to select signals SASEL0 and SASEL1, both of which are asserted. Column select logic CS to the left of each sense amplifier stripe therefore asserts local column select signals LCSL0[0] and LCSL1[0] to respective sense amplifier stripes SAS0 and SAS1. Column select signal LCSL0[0] activates the bit switches BS associated with sense amplifiers SA00 and SA02 in stripe SAS0, while column select signal LCSL1[0] activates the bit switches BS associated with sense amplifiers SA11 and SA13 in stripe SAS1. As a consequence, the bitlines associated with the highlighted memory cells are connected to the "true" main data lines MDQ[3:0] and the complementary bitlines are connected to the "complement" data lines /MDQ[3:0]. The sensed contents of the selected memory cells are therefore presented on the main data lines as four complementary signal pairs. The four unselected memory cells associated with local wordline LWL0 can likewise be selected by asserting main column select signal MCSL1 in lieu of MCSL0, and other rows of cells can be selected by asserting others of the local wordline select signals LWLSEL[3:1]. While only the data lines are shown to be differential, others of the signals can likewise be conveyed differentially, as will be evident to those of skill in the art.

Figure 4:
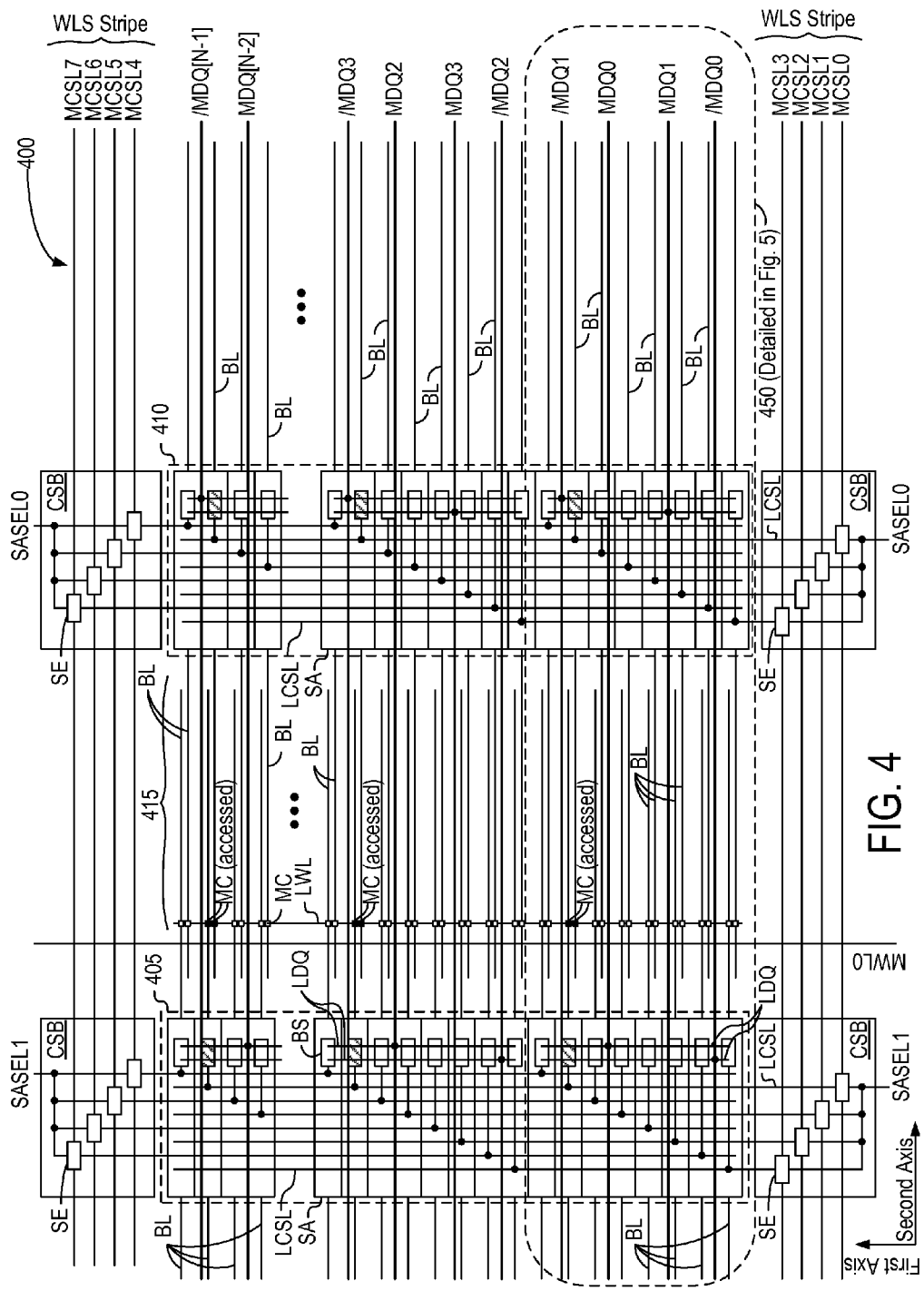
FIG. 4 depicts a portion of a hierarchical memory array 400 in accordance with an embodiment that includes a sub-array with a number of memory cells appropriate for a practical memory device.

FIG. 4 depicts a portion of a hierarchical memory array 400 in accordance with an embodiment that includes a sub-array with a number of memory cells appropriate for a practical memory device. The depiction of memory array 400 is rotated 90 degrees compared with the illustrations of FIGS. 1 and 3, so the first and second axes are vertical and horizontal, respectively.

The depicted portion includes left and right sense amplifier stripes 405 and 410, each of which extends between a pair of column-select blocks CSB. A sub-array 415 of memory cells is disposed between sense amplifier stripes 405 and 410, and includes memory cells MC, bitlines BL, and a local wordline LWL. The data width N of the sub-array is e.g. 32 bits (i.e., N=32) in this example. Each sense-amplifier stripe 405 and 410 includes bit-select logic BS for each of 4N sense amplifiers. Subsets of eight sense amplifiers additionally include parallel, complementary pairs of local data lines LDQ, each of which is fixedly connected to one of 2N true and complementary main data lines MDQ[N-1:0] and /MDQ[N-1:0]. Because N is 32 in this example, there are 32 pairs of complementary main data lines and 64 local data lines LDQ in each sense amplifier stripe.

While the illustration includes only a single local wordline LWL, a subset of associated memory cells MC, and a few dozen bitlines BL, the sub-array includes 256 bitlines, 256 wordlines, and 65,536 memory cells in this embodiment. Other embodiments can have more or fewer wordlines, bitlines, or both. Arrays of sub-arrays can be used to form memory banks, and multiple banks can be instantiated on a single IC. A DRAM IC might include, for example, eight memory banks, each of which includes an 8×16 array of sub-arrays like the example of FIG. 4.

Each local data-line pair (pair of LDQs) in a given sense amplifier stripe serves eight sense amplifiers, and can thus provide the contents of one of eight memory cells in the sub-array to the associated complementary pair of main data lines. The sub-array's 256 bitlines can thus be accessed using the main data lines as eight 32-bit-wide columns. An embodiment with 512 bitlines per sub-array similarly divided into eight columns would provide data via 64 pairs of main data lines. For comparison, a conventional memory sub-array of the same size and with similar routing resources for data and column-select signals may provide data via just four pairs of main data lines. One such memory sub-array is described in Y. Nitta et. al., "A 1.6 Gb/s Data Rate 1 Gb Synchronous DRAM with Hierarchical Square Shaped Memory Block and Distributed Bank Architecture," pg. 376, Proc. International Conference on Solid State Circuits, 2006. As compared with this conventional memory architecture, the embodiment of FIG. 4 thus increases data width by a factor of eight or sixteen for a given sub-array width, and consequently for a given page size. This dramatic width improvement is obtained with little increase in logical complexity or circuit area.

One reason for the dramatic data-width increase is the relative placement of the main data lines vs. the main column-select lines. In Nitta et al., the main data lines extend between the memory sub-arrays, from a perspective perpendicular to the first and second axes, and the main column-select lines extend over the memory sub-arrays. In contrast, the main data lines in the embodiment of FIG. 4 extend over the memory sub-arrays, rather than over the relatively narrow space between them. In general, the memory sub-arrays are considerably wider than the space that separates them, so routing the main data lines over the sub-arrays permits more main data lines, and consequently greater data widths. The embodiments disclosed herein also require fewer main column-select lines for efficient routing between the sub-arrays. In general, the embodiment of FIG. 4 includes N main data lines and M main column-select lines, where N is significantly greater than M.

Main data lines that extend along the edges of memory sub-arrays may not literally extend over the sub-arrays, as the boundaries of the various elements can vary due to design and layout choices and constraints. When it is said that the main data lines extend over the memory sub-arrays, therefore, it means that the vast majority (over 90%) of the main data lines are so routed with some possible exceptions near the edges of the sub-arrays. In the embodiment of FIG. 4, for example, main data lines MDQ[N-1] might extend close to or within the upper WLS stripe. Similarly, peripheral ones of eight main column-select lines MCSL[7:0] may overlap the memory sub-arrays.

Each column select block CS includes four switching elements SE that combine a sense amplifier select signal SASEL[1,0] with a main column select signal MCSL[3:0] to select one of eight groups of sense amplifiers SA, and consequently to select one of eight groups of bitlines BL. In this example, a local wordline signal LWL is asserted to open the depicted row of memory cells, the contents of which are captured in the sense amplifiers of both sense amplifier stripes. Main column select signal MCSL0 and sense amplifier select signals SASEL1 and SASEL0 are also asserted to cause the highlighted bit-select logic BS to connect the associated true and complementary bitlines to the associated local data lines LDQ, and consequently to a complementary pair of main data lines MDQ. A dashed border 450 encompassing the lower eight sense amplifiers in each stripe and the related signal paths identifies circuit structures described below in more detail in connection with FIG. 5.

Figure 5:
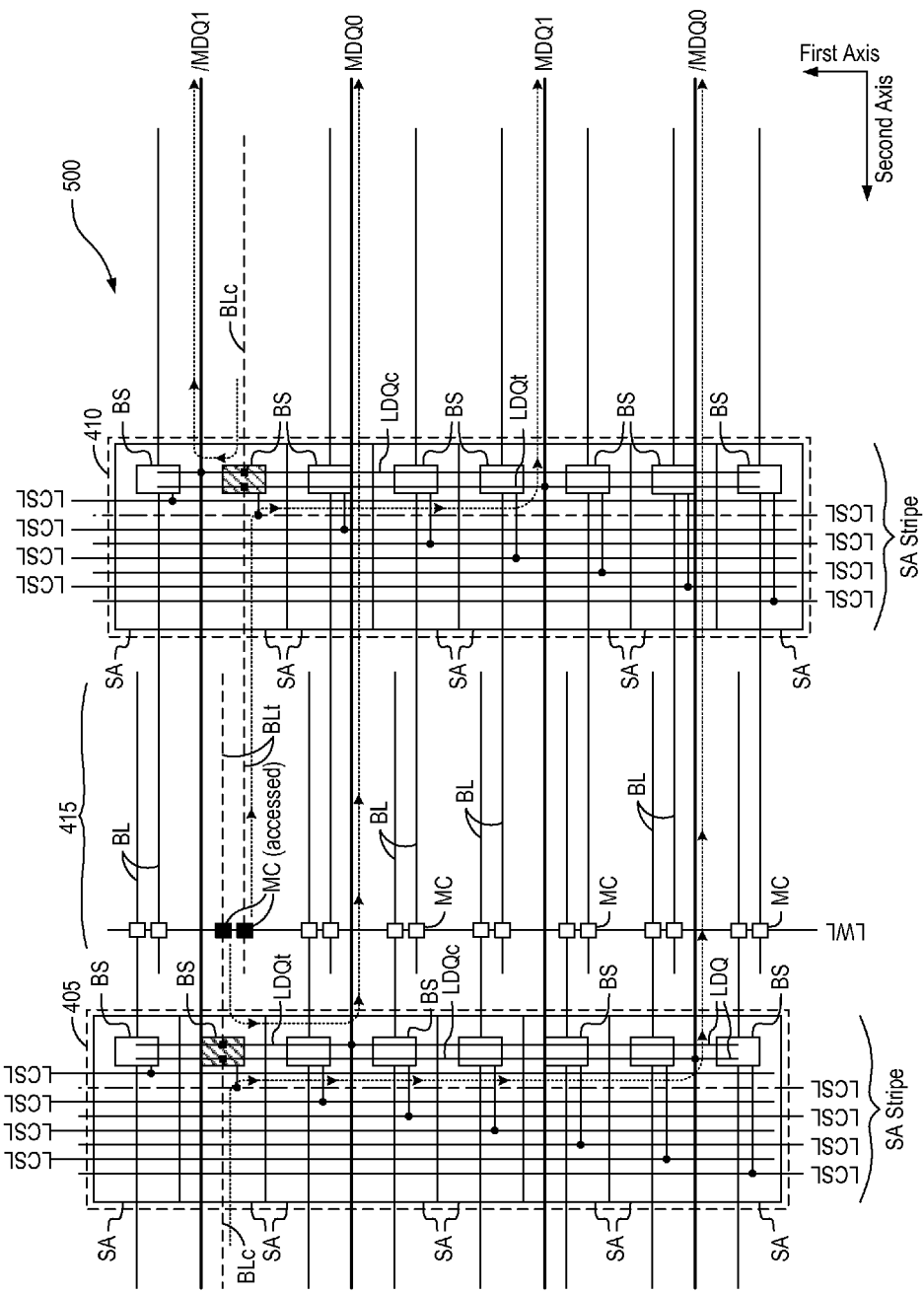
FIG. 5 provides an expanded view of the portion of FIG. 4 encompassed in a dashed boundary.

FIG. 5 provides an expanded view of the portion of FIG. 4 encompassed in dashed border 450. The example shows how two highlighted memory cells are sensed and their respective contents provided on two complementary pairs of main data lines. The select signal on the dashed local column-select line LCSL is asserted for each sense-amplifier stripe. The highlighted bit switches BS, which may be as shown in FIG. 3, respond to local column select signals LCSL by connecting their respective true and complement bitlines BLt and BLc to the respective true and complement local data lines LDQt and LDQc. The "true" signals are those that convey the sensed contents of the addressed memory cell. The "complement" signals convey the relative value of the complementary bitline, and serve as a reference in support of differential sensing. These labels are for ease of illustration: in a practical memory system most bitlines can alternate between sensing a memory cell and serving as the complementary reference. For example, complementary bitlines BLc in FIG. 5 may extend over adjacent sub-arrays (not shown) to provide access to additional sets of memory cells.

Dotted arrows indicate the direction of information flow from the two accessed memory cells MC to the four main data lines MDQ0, /MDQ0, MDQ1, and /MDQ1. In the leftmost sense amplifier stripe 405, the selected bit-select logic BS, shaded for emphasis, connects its true and complementary bitlines BLt and BLc to respective local data lines LDQt and LDQc. These local data lines are electrically the same nodes as respective main data lines MDQ0 and /MDQ0, so the signal sensed from the selected memory cell is directed to main data lines MDQ0 and /MDQ0. In the rightmost sense amplifier stripe 410, the selected bit-select logic BS connects its bitlines BLt and BLc to respective local data lines LDQt and LDQc, and thus directs the sensed complementary signal to main data lines MDQ1 and /MDQ1.

Figure 6:
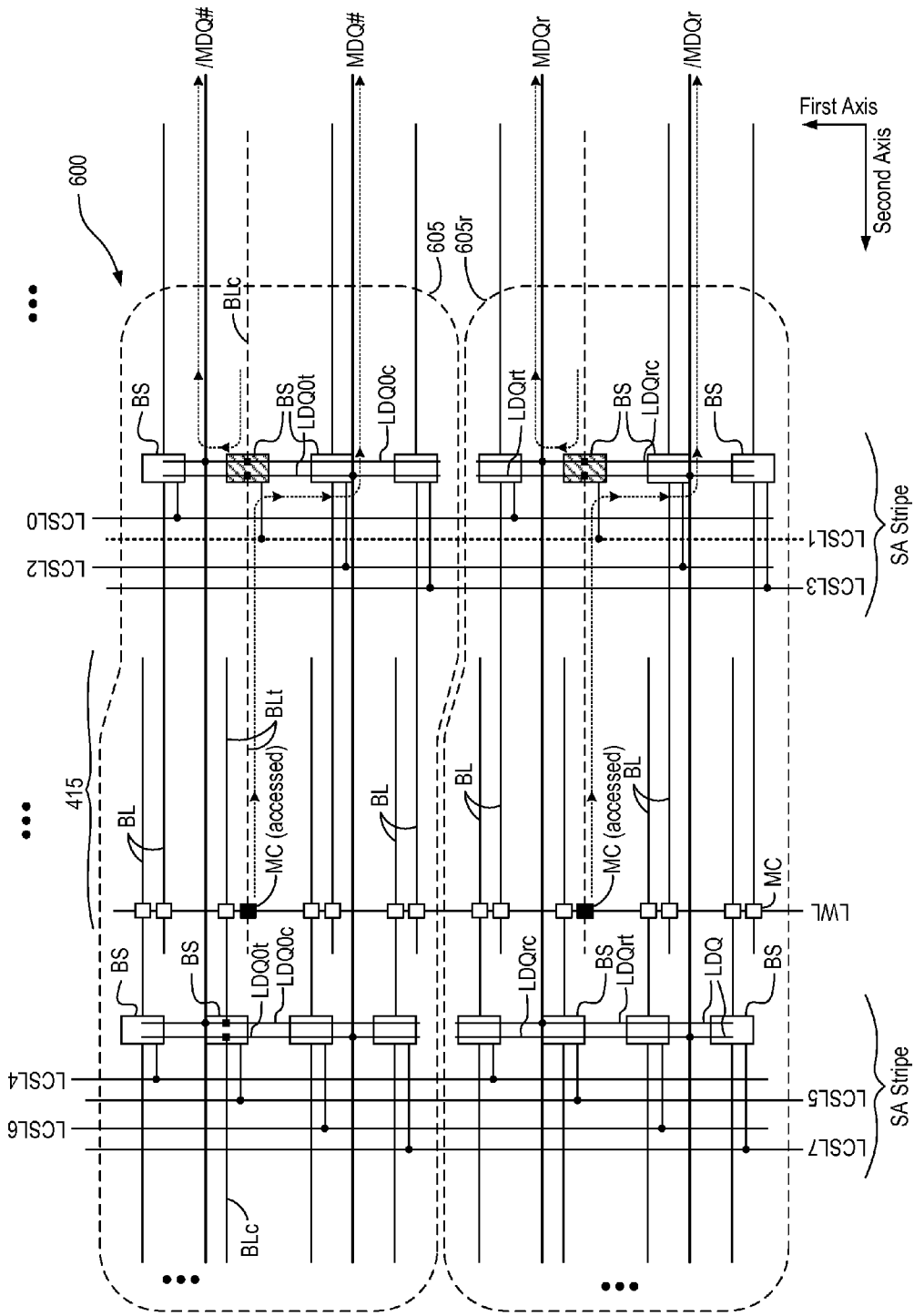
FIG. 6 depicts a portion of hierarchical memory 600 in accordance with another embodiment.

FIG. 6 depicts a portion of hierarchical memory 600 in accordance with another embodiment. The portion depicted in FIG. 6 is similar to that of FIG. 4, with like-identified elements being the same or similar. Some features have been omitted from FIG. 6 for ease of illustration. In this example each main-data-line pair and related memory resources forms a respective main data unit 605 and 605r. In this example, the lower main data unit 605r is associated with a pair of redundant main data lines MDQr and /MDQr, while the upper main data unit 605 is associated with one of 32 additional pairs of main data lines MDQ[31:0] and /MDQ[32:0]. In this embodiment the main data units 605 and 605r are identical, and either one can be considered the redundant resource.

The main data units share common local column-select signals LCSL[7:0], which allows one main data unit to be substituted for another without changing the column addressing used for memory access. Should main data unit 605 include defective memory resources, for example, main data unit 605r can be used instead without changing the column-addressing scheme. As discussed below in detail, defective memory resources are substituted for good ones using row address signals and without remapping column addresses. Row address signals are commonly available before column access signals, so basing resource substitution on row addresses allows more time for resource substitution.

As with the example of FIG. 5, this example shows how two highlighted memory cells are sensed and their respective contents provided on two complementary pairs of main data lines. The select signal on the dashed local column-select line LCSL1 is asserted, which induces the highlighted bit switches BS to connect their respective true and complement bitlines BLt and BLc to respective true and complement local data lines (LDQ0t and LDQc in data unit 605 and LDQrt and LDQrc in data unit 605r). Main data units can be sized differently in other embodiments (e.g., including two main-data-line pairs rather than one). The use and benefits of embodiments like that of FIG. 6 are detailed below in connection with FIGS. 8-12.

Figure 7:
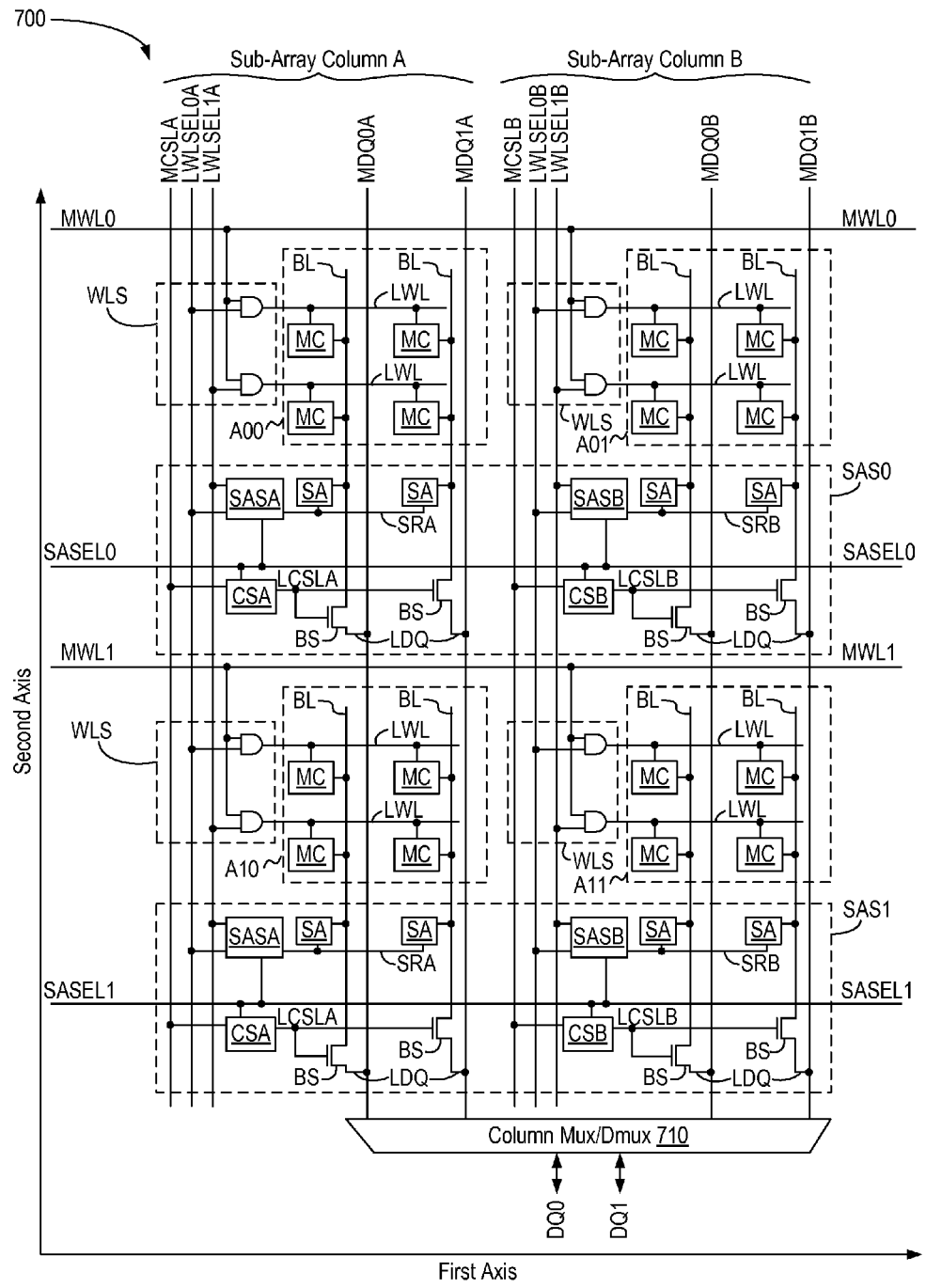
FIG. 7 depicts a portion of a DRAM device 700 upon which is instantiated a hierarchical memory array in accordance with an embodiment that supports "sub-page" accesses to reduce power consumption.

FIG. 7 depicts a portion of a DRAM device 700 upon which is instantiated a hierarchical memory array in accordance with an embodiment that supports "sub-page" accesses to reduce power consumption. DRAM device 700 has much in common with DRAM device 100 of FIG. 1, with like-labeled elements being the same or similar. A detailed discussion of similar elements is omitted from the discussion of FIG. 7 for brevity.

With reference to FIG. 1, asserting one of select signals SASEL0 or SASEL1 activates an entire page of sense amplifiers, two sense amplifiers for each of two memory sub-arrays, to read a selected row of memory cells. For example, asserting sense-amplifier select signal SASEL0 activates the four sense amplifiers SA in sense-amplifier stripe SAS0. Column select logic CS then selects one bitline BL from each of sub-arrays A00 and A01 to convey two bits of data on main data lines MDQ0 and MDQ1. Four memory cells MC are therefore sensed to provide two bits of data.

Turning to FIG. 7, device 700 improves power efficiency relative to the embodiment of FIG. 1 by sensing fewer memory cells—e.g. a "sub-page"—for a given quantity of data. As in the example of FIG. 1, a page in device 700 includes four memory cells MC, two in each of two adjacent sub-arrays (e.g., the topmost two memory cells in each of sub-arrays A00 and A01). Rather than sense all four cells in one page to access two memory cells, as did the embodiment of FIG. 1, device 700 senses only two memory cells to access two bits. To accomplish this, separate control signals are provided to the two sub-array columns A and B, each of which provides two-bit-wide data from one of the two constituent sub-arrays. For example, sub-array column A can produce two bits of data MDQ0A and MDQ1A from either sub-array A00 or A10. A column multiplexer/demultiplexer decodes row address information (not shown) to select between sub-array columns A and B when communicating two-bit data DQ0 and DQ1 to and from device 700.

With reference to the upper left sub-array A00, each row of memory cells MC is coupled to wordline select logic WLS via a common local wordline LWL, and each column of memory cells is connected to a corresponding sense amplifier SA via a respective bitline BL. To read a given memory cell in sub-array A00, device 100 activates both memory cells MC in the selected row using the corresponding local wordline LWL, and thus presents the contents of the row of memory cells to the sense amplifiers. The sense amplifiers SA sense the row of data, and the contents of the one sense amplifier associated with the selected column is then read.

Control lines to sub-array column A convey a main column-select signal MCSLA and two local wordline select signals LWLSEL0A and LWLSEL1A. These signals control sense-amplifier-select logic SASA and column-select logic CSA in each of two sense-amplifier stripes SAS0 and SAS1. Select logic SASA issues a sub-page signal SPA that selectively enables a collection of sense amplifiers SA to communicate data between a row, or sub-page, of memory cells in sub-array A00 and two main data lines MDQ0A and MDQ1A. Control lines to sub-array column B similarly use a main column-select signal MCSLB and two local wordline select signals LWLSEL0B and LWLSEL1B to control sense-amplifier-select logic SASB and column-select logic CSB to communicate data between pairs of memory cells and two main data lines MDQ0B and MDQ1B. Sense amplifier stripes SAS0 and SAS1 are thus able to activate alternative rows of memory cells, rather than an entire page, to communicate two bits of data. Device 700 selects between sub-array columns A and B based upon a decoded row-address (not shown), the same row-address multiplexer/demultiplexers 710 uses to select between pairs of main data lines.

The following discussion focuses on stripe SAS0 and memory sub-array A00. Wordline select logic WLS adjacent sub-array A00 selectively connects main wordline MWL0 to one of the two local wordlines LWL in sub-array A00. Asserting local wordline signals LWL in one sub-array opens a row of memory cells MC. Sense-amplifier select logic SASA asserts sub-page signal SPA responsive to select signal SASEL0 and one of local wordline select signals LWLSEL0A and LWLSEL1A. Sub-page signal SPA enables two sense amplifiers SA in stripe SAS0 to sense and amplify the data stored in the open row. Column-select logic CSA, responsive to sense-amplifier select signal SASEL0 and main column-select signal MCSLA, asserts a local column-select signal LCSLA to bit-select logic BS to connect the active sense amplifiers to main data lines MDQ0A and MDQ1A. Other embodiments can be configured or requested to provide both full-page and sub-page access.

In the embodiment of FIG. 7, all sensed memory cells MC connected to a given local wordline LWL are accessed. In a practical embodiment, it is likely that only a subset of such memory cells would be accessed. Using the sub-array in FIGS. 4 and 5 for illustration, only two memory cells are accessed per sixteen active sense amplifiers associated with a local wordline LWL. Such an embodiment can be modified to support sub-page access using additional column-select logic to select between sub-sets of local wordlines that together provide access to an entire page.

Redundant Memory Resources

The following discussion describes how embodiments of the memory systems disclosed herein can be adapted to provide efficient memory-resource redundancy schemes. Defective resources, identified using conventional test procedures, are associated with data lines. Redundant data-line resources are then substituted for defective ones by consideration of row-address bits. In memory systems in which row addresses arrive before the column addresses, employing the row address to identify defective resources allows more time for resource substitution, and consequently supports improved memory-access speeds, more space and power efficient control circuitry, or both.

Figure 8:
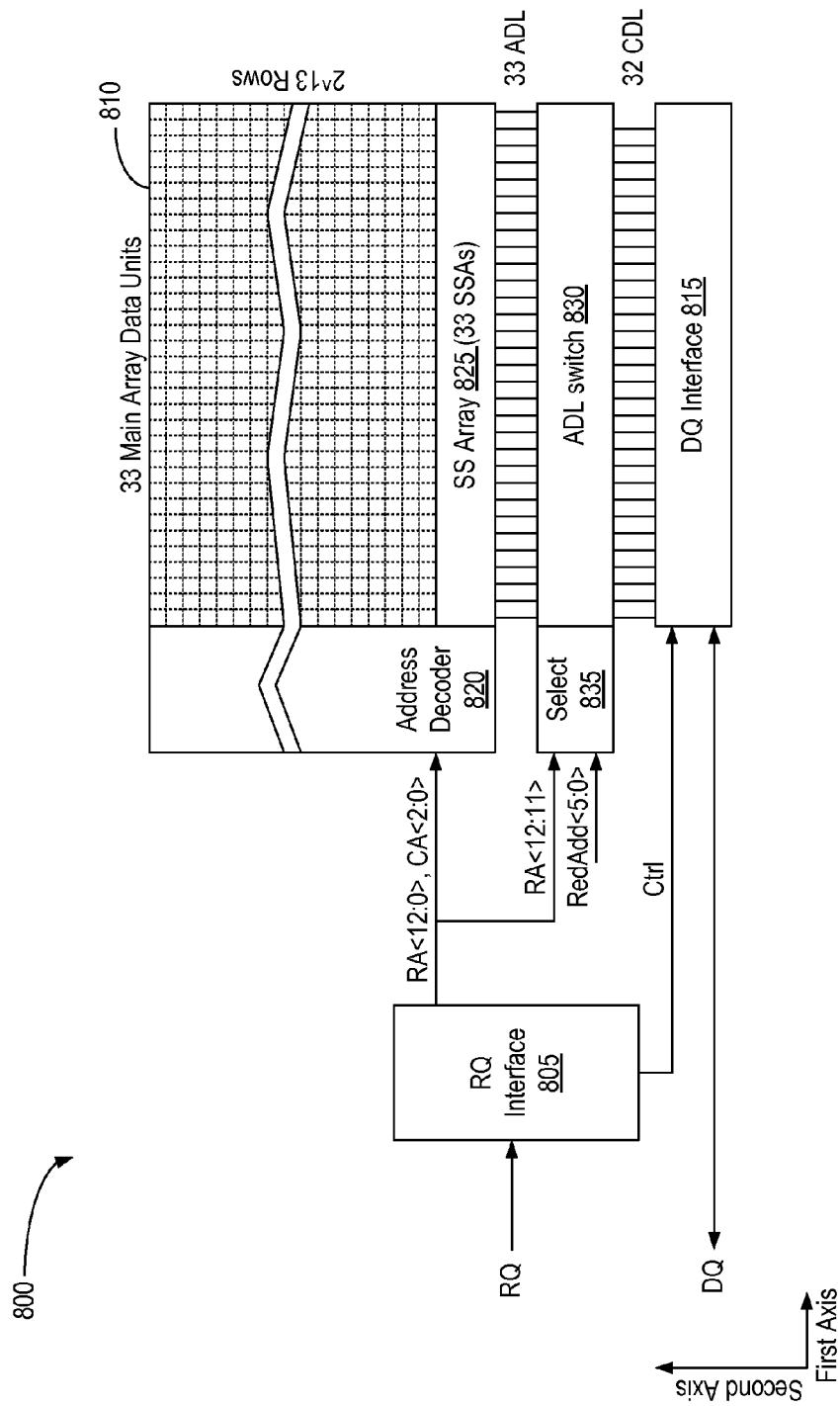
FIG. 8 depicts a memory 800 in accordance with an embodiment that substitutes defective memory resources for good ones by decoding row-address signals.

FIG. 8 depicts a memory 800 in accordance with an embodiment that substitutes defective memory resources for good ones by decoding row-address signals. Memory 800 includes a conventional memory interface 805 that decodes memory requests RQ, in part to derive row address signals RA<12:0> and column address signals <2:0> for application to a memory array 810 and a data interface 815. Memory array 810, in turn, includes an address decoder 820 that decodes (1) column addresses CA<2:0> to select one of eight columns within each of thirty-three main data units and (2) row addresses RA<12:0> to select one of 2^13 rows of memory cells. Selecting a column conveys one bit of data from each main data unit to a corresponding one of thirty-three secondary sense amplifier (SSA) in a sense-amplifier array 825. These sense amplifiers are considered "secondary" to distinguish them from the sense amplifiers within the sense-amplifier stripes in the array. In one embodiment the array data units are like data units 605 and 605*r* described above in connection with FIG. 6.

The thirty-three sense amplifiers of array 825 are coupled to a data-line switch 830 via respective array data lines ADL. Switch 830 connects a subset of the thirty-three array data lines to column data lines CDL, of which there are thirty-two in this embodiment. In other words, ADL switch 830 selectively removes one of array data lines ADL. Should one of the array data lines be found to be associated with defective memory resources, for example, select logic 835 associated with ADL switch 830 is provided a redundant-address select signal RedAdd<5:0> that specifies the defective main array data unit. Select logic 835 then considers row-addresses bits RA<12:11> to determine whether a given memory access is directed to the defective main array data unit. If so, the defective memory array unit is substituted for a good one by excluding the associated array data line ADL in favor of another.

Data interface 815 sends and receives data to switch 830 via the thirty-two column data lines CDL. Interface 805 additionally provides control signals Ctrl to interface 815 in support of various conventional operations, such as to distinguish between read and write accesses and to address different subsets of available data lines if less than all the available data lines are to be accessed to receive or convey data DQ. The operations of interfaces 805 and 815 are well known to those of skill in the art, so a detailed discussion of interfaces 805 and 815 is omitted for brevity.

Figure 9:
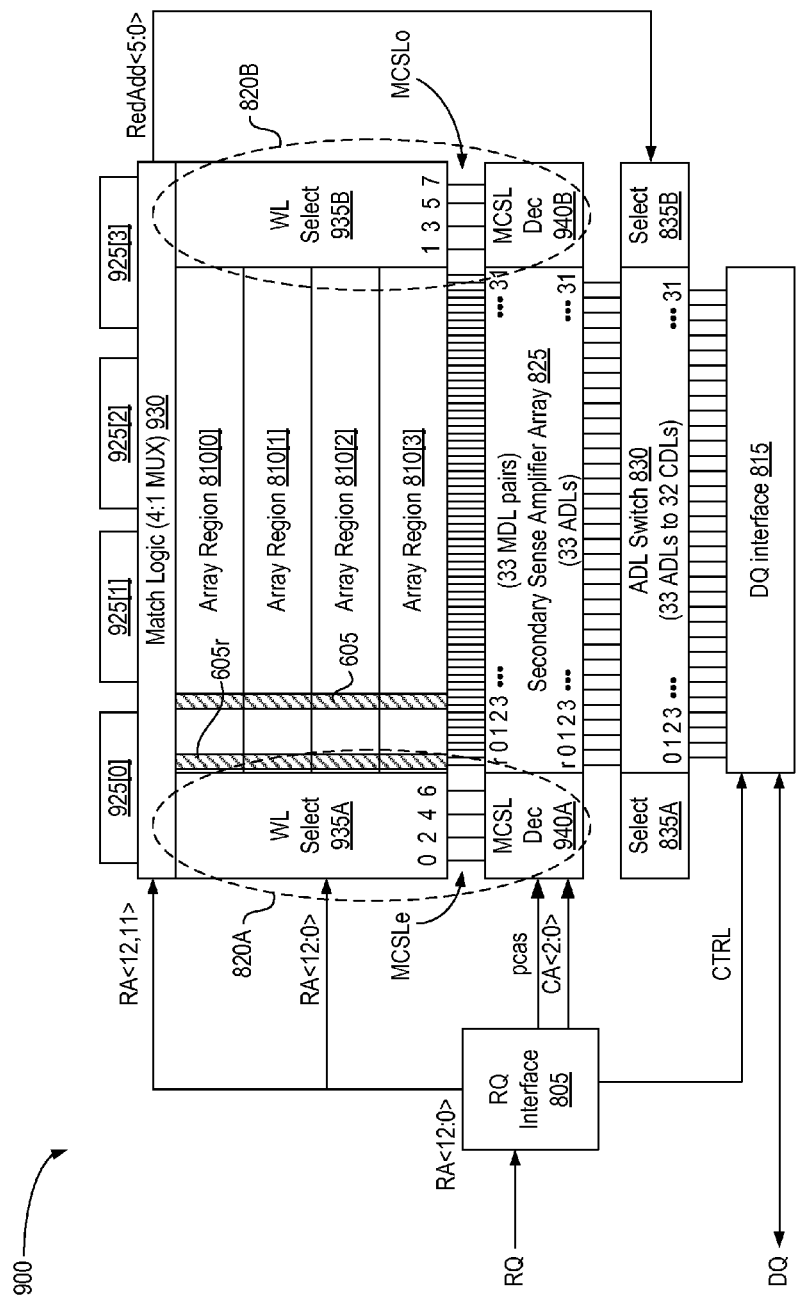
FIG. 9 depicts a memory 900 in accordance with another embodiment.

FIG. 9 depicts a memory 900 in accordance with another embodiment. Memory 900 is similar to memory 800, with like-identified elements being the same or similar. Address decoder 820 is divided into two portions 820A and 820B, a common arrangement used for routing efficiency. Select logic 835 is likewise divided into portions 835A and 835B. Though the control signals are shown connected to only one portion of address decoder 820 and select logic 835, this is for ease of illustration. In each case the requisite control signals are conveyed to both portions as needed.

Memory array 810 is divided into four regions 810[3:0], each of which includes 2^11 rows of memory cells. There can be more or fewer regions in other embodiments. As described previously, thirty-two main array data units 605, one of which is shown, and a redundant main array data unit 605*r* vertically traverse all four array regions. Each array data unit includes a complementary set of main data line pairs, which are coupled to respective sense amplifiers in sense-amplifier array 825. The sense amplifiers of array 825 convert the complementary signals to and from single-ended signals on thirty-three array data lines to switch 830. Switch 830, at the direction of select logic 835A and 835B, connects thirty-two of the thirty-three array data lines to data interface 815.

Dividing array 810 into four regions improves coverage for redundant memory resources. Assuming, for example, that the portion of data unit 605 in array region 810[0] includes defective memory resources but those portions in regions 810[3:1] are good, then redundant data unit 605*r* can be substituted for the defective data unit 605 only when memory requests are directed to rows within array regions 810[0]. In this way, redundant data unit 605*r* can substitute for defective resources in more than one defective data unit. Further, though only one data unit is designated as redundant, that unit need not be in any way different from the others, and different embodiments can be provided with different types or amounts of redundant resources.

Memory 900 selects between array regions using match logic 930 and four banks of storage elements 925[3:0], which may be banks of fuses or some other storage mechanism. Each collection of storage elements corresponds to one of the array regions and stores a six-bit binary number that uniquely identifies one of the array data lines. One can therefore specify a defective memory resource within a given array region by programming the corresponding storage element with a six-bit number specifying the main data-line pair associated with the defective resource. If the highlighted data unit 605 includes defective resources in array region 810[3], for example, storage elements 925[3] can be programmed to indicate the need to substitute that data unit with data unit 605r when rows within array unit 810[3] are accessed.

Wordline select logic 935A/B within decoder 820A/B uses all the row-address bits RA<12:0> to select the addressed row. The two-most significant bits of row address RA<12,11> distinguish the four array regions, and are used by match logic 930 to present the contents of one bank of storage elements 925[3:0] as signal RedAdd<5:0> to select logic 835A/B. A main column select decoder 940A/B decodes main column-select signals from column addresses CA<2:0>, a process that is timed with respect to a column-access strobe pcas from request interface 805. The decoding and application of row and column signals is detailed above in connection with the embodiments of FIGS. 1-5.

Figure 10:
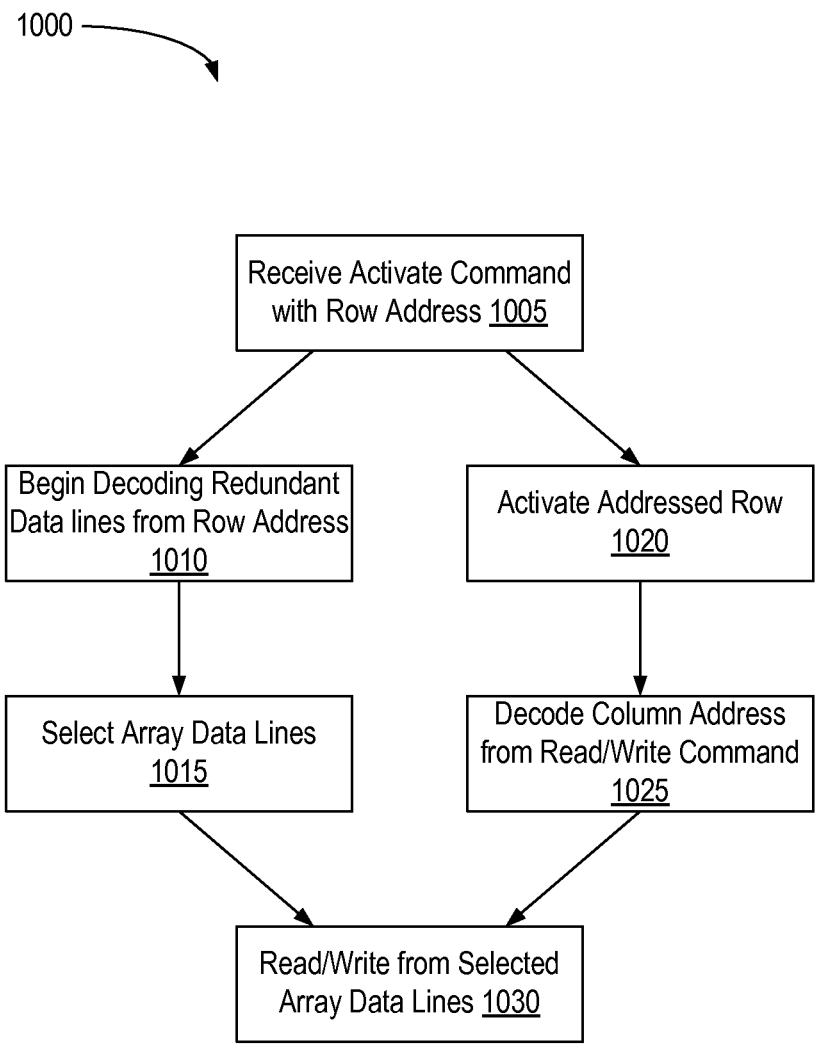
FIG. 10 is a flowchart 1000 illustrating the operation of memory 900 of FIG. 9 in accordance with one embodiment.

FIG. 10 is a flowchart 1000 illustrating the operation of memory 900 of FIG. 9 in accordance with one embodiment. The process begins at 1005 when RQ interface 805 decodes an activate command from e.g. a memory controller or processor (not shown) to obtain a row address RA<12:0>. This decoding can support row redundancy. In an example of a row redundancy hit in one embodiment, the decoding replaces an external address RA<12:0> with the internal address of a redundant row to be used. In that case, the row address that flows from 1005 can be the internal address after row redundancy evaluation.

The row address decoded from 1005 is applied to match logic 930 and wordline select logic 935A/B. Match logic 930 selects one of the banks of storage elements 925[3:0] based on row-address bits RA<12,11> and passes the contents to select logic 835A/B as signal RedAdd<5:0> (1010). Select logic 835A/B then controls ADL switch 830 to connect a thirty-two-bit subset of the thirty-three array data lines to the thirty-two column data lines CDL (1015), the subset selected based on the value of signal RedAdd<5:0> to preclude any array data line ADL identified as associated with defective memory resources.

Wordline select logic 935A/B and array 810 begin the process of activating the addressed row (1020) as soon as the row address is available. At some point, RQ interface 805 decodes a read or write command that specifies a column address CA<2:0> (1025) and uses the decoded column information to select a column in array 810. Finally, at 1030, data DQ is conveyed to or from interface 815, depending upon whether the command is for a write or a read operation.

Some conventional redundancy schemes identify defective memory resources by column address. Such systems therefore decode column addresses to identify memory resources in need of replacement. The embodiment of FIGS. 9 and 10 instead decodes the row address to identify memory resources in need of replacement. In system where the row address is available before the column address, the process of FIG. 10 allows more time for address decoding and resource substitution. This time can be used to improve speed performance and relaxes timing requirements for the decoding and substitution. In the embodiment of FIG. 9, this relaxation allows the fuses and related circuitry to be physically disposed on the side of array 810 opposite the interface. This is an important advantage, as the interface side of memory 900 is generally more spatially restricted than the other side of the array.

Figure 11:
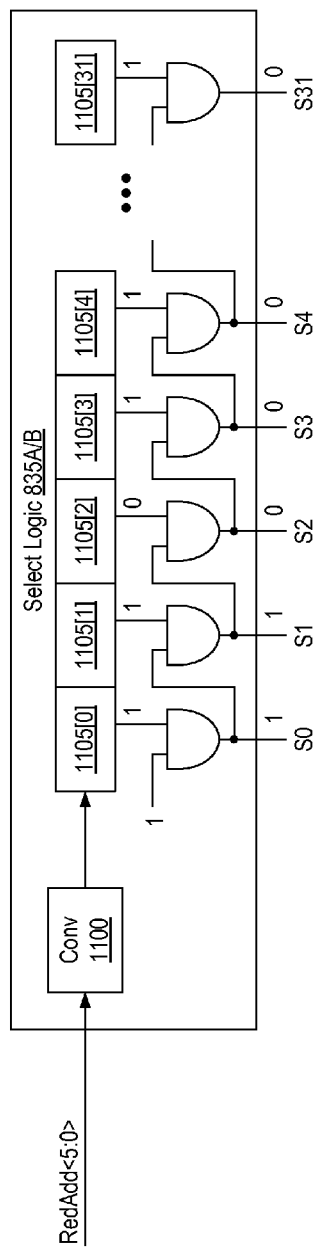
FIG. 11 depicts an embodiment of select logic 835A/B of FIG. 8 in accordance with one embodiment.

FIG. 11 depicts an embodiment of select logic 835A/B of FIG. 8 in accordance with one embodiment. Select logic 835A/B includes conversion logic 1100 that converts signal RedAdd<5:0> into a thirty-two bit serial data string that is loaded into a series of storage elements 1105[31:0], thirty-two latches in one embodiment. The outputs of the storage elements are provided to a series of AND gates to produce thirty-two select signals S[31:0] that control ADL switch 830 (FIG. 8).

Conversion logic 1100 behaves as follows. If bit RedAdd<5> is a logic one, then each of storage elements 1105[31:0] is loaded with a logic one. As a consequence, all outputs S[31:0] from the AND gates are set to one. As detailed below in connection with FIG. 12, this setting connects array data lines ADL[31:0] to respective ones of column data lines CDL[31:0], leaving redundant array data line ADLr unused.

If bit RedAdd<5> is a logic zero, then bits RedAdd<4:0> are decoded to create a serial data stream that includes a single zero in the bit position that corresponds to a defective memory resource. In the illustration of FIG. 11, bits RedAdd<4:0> are 00010b (decimal value of 2) to indicate that data line ADL[2] is to be substituted. Storage element 1105[2] is therefore loaded with a logic zero while the remaining storage elements are loaded with a logic one. The AND gates combine these stored values to produce a thermometer-coded select signal S[31:0] in which the first to bits S[1:0] are one and the remaining bits S[31:2] are zero.

Figure 12:
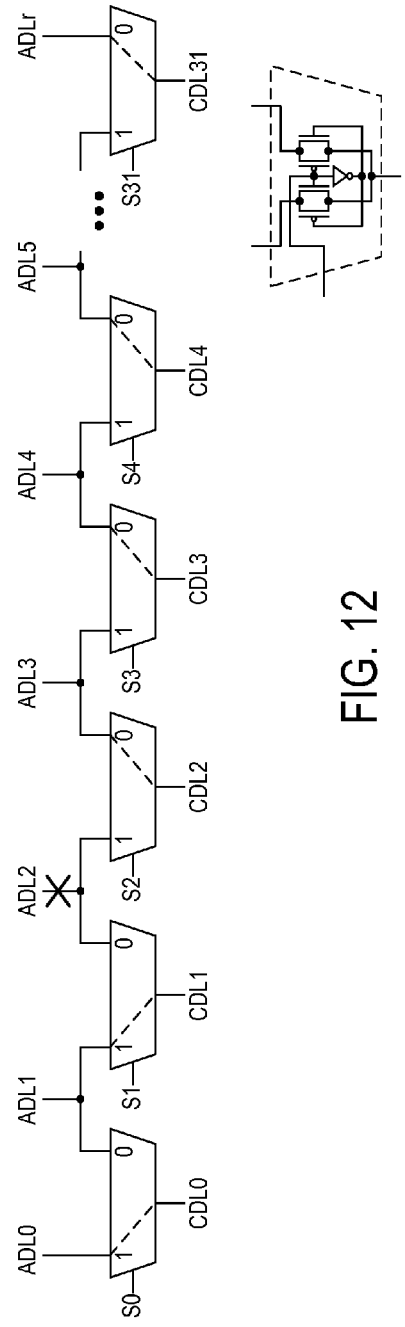
FIG. 12 depicts an embodiment of ADL switch 830 adapted to work with the embodiment of select logic 835A/B depicted in FIG. 11.

FIG. 12 depicts an embodiment of ADL switch 830 adapted to work with the embodiment of select logic 835A/B depicted in FIG. 11. Switch 830 includes thirty-two multiplexers, an example of which is detailed at the lower right. Each multiplexer includes two input nodes coupled to a pair of the thirty-three array data lines ADL[31:0,r]. These multiplexers couple a thirty-two-bit subset of the array data lines to column data lines CDL[31:0].

Following the first example of FIG. 11, in which signals S[31:0] are all set to one, each multiplexer directs an array data line ADL[31:0] to a corresponding column data line CDL[31:0]: the redundant array data line ADLr is ignored. Turning to the second example of FIG. 11, the one in which array data line ADL2 has been deemed to be associated with defective memory resources, select logic 835A/B sets the values of select signals S[1:0] to one and the remaining signals S[31:2] to zero. In that case, as shown in FIG. 12, select signals S[31:0] control the multiplexers to omit a connection to ADL2 in favor of one to redundant array data line ADLr.

Recalling the discussion of FIG. 8, signal RedAdd[5:0] is selected using row address bits RA<5,4> to distinguish between array regions 810[3:0]. A single redundant array data line can thus be used to substitute for as many as four defective collections of memory resources in this embodiment. Substituting defective array data units based on row-address signals thus provides more efficient allocation of redundant resources. This efficiency reduces area and power requirements.

In the foregoing description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Similarly, signals described or depicted as having active-high or active-low logic levels may have opposite logic levels in alternative embodiments.

As another example, circuits described or depicted as including metal oxide semiconductor (MOS) transistors may alternatively be implemented using bipolar technology or any other technology in which a signal-controlled current flow may be achieved. With respect to terminology, a signal is said to be "asserted" when the signal is driven to a low or high logic state (or charged to a high logic state or discharged to a low logic state) to indicate a particular condition. Conversely, a signal is said to be "de-asserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or de-asserts, if explicitly stated or indicated by context) the signal on a signal line coupled between the signal driving and signal receiving circuits. A signal line is said to be "activated" when a signal is asserted on the signal line, and "deactivated" when the signal is de-asserted. Additionally, the prefix symbol "/" attached to signal names indicates that the signal is an active low signal (i.e., the asserted state is a logic low state). In any case, whether a given signal is an active low or an active high will be evident to those of skill in the art.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein.

While the present invention has been described in connection with specific embodiments, variations of these embodiments are also envisioned. For example, the foregoing examples can be adapted for use in various array architectures, including the well-known open bitline and folded bitline architectures. These examples are in no way exhaustive, as many alternatives within the scope of the claims will be obvious to those of ordinary skill in the art. Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. For U.S. applications, only those claims specifically reciting "means for" or "step for" should be construed in the manner required under the sixth paragraph of 35 U.S.C. Section 112.

What is claimed is:

1. A memory comprising:
   a memory array with data units, including a redundant data unit, to store data;
   an interface coupled to the memory array to receive address information for a data transaction;
   storage elements to store a number indicative of a defective one of the data units;
   data lines extending from the memory array to communicate the data; and
   a data-line switch coupled to the data lines and the storage element, the switch to select a strict subset of the data lines responsive to the number and a subset of the address information;
   wherein the address information comprises a row address and a column address received after the row address, the data-line switch selecting the strict subset of the data lines prior to receipt of the column address.

2. The memory of claim 1, wherein the address information comprises a row address.

3. The memory of claim 2, wherein the subset of the address information is a strict subset of bits specifying the row address.

4. The memory of claim 1, wherein the storage elements include fuses.

5. The memory of claim 1, wherein the strict subset of the data lines excludes one of the data lines, the memory further comprising match logic coupled to the storage elements to select the excluded data line based on the subset of the address information.

6. The memory of claim 1, wherein the memory array is physically disposed between the storage elements and the data-line switch.

7. The memory of claim 1, wherein the data units are organized in array regions and the storage elements are one of a plurality of collections of storage elements, and wherein each of the collections corresponds to one of the array regions.

8. The memory of claim 1, wherein each data unit includes a main-data-line pair.

9. A memory comprising:
   a memory array having memory cells arranged in rows and columns, the rows and columns connected to respective wordlines and bitlines, each memory cell including a control terminal coupled to a corresponding one of the wordlines and a data terminal selectively coupled through a corresponding one of the bitlines to a corresponding one of data lines;
   an address decoder to selectively assert, for a given row address, a row-address signal on a respective wordline to enable a respective row of memory cells; and
   a data-line switch coupled to the data lines, the switch to select a strict subset of the data lines responsive to a strict subset of the row-address signals.

10. The memory of claim 9, the memory array including a plurality of column-select lines extending over the data units perpendicular to the data lines to provide the column-select signals to the data units.

11. The memory of claim 10, wherein each of the data units receives the same column-select signals.

12. The memory of claim 9, wherein the row-address signals specify a number of row-address bits, wherein the memory array is divided into array regions separately addressed using respective values for a strict subset of the row-address bits, and wherein the data-line switch selects the strict subset of the data lines responsive to the strict subset of the row-address bits.

13. The memory of claim 12, further comprising, for each array region, a storage element to identify an excluded data line for memory accesses to the region.

14. The memory of claim 13, wherein the storage elements include fuses.

15. The memory of claim 13, further comprising match logic coupled to the storage elements to select one of the excluded data lines based on the strict subset of the row-address signals.

16. The memory of claim 13, wherein the memory array is physically disposed between the storage elements and the data-line switch.

17. The memory of claim 9, the strict subset of the data lines to collectively convey data of a data width expressed as single-ended or differential signals.

18. The memory of claim 9:
wherein each of the data lines is selectively coupled to a respective strict subset of the bitlines and memory cells;
wherein the subset of the bitlines and memory cells selectively coupled to one of the data lines comprises defective memory resources within a range of the row addresses; and
wherein the data-line switch excludes the one of the data lines responsive to the strict subset of the row-address signals corresponding to the range of the row addresses.

19. The memory of claim 18, wherein the data-line switch includes the one of the data lines that comprises the defective memory resources within the range of the row addresses responsive to a second strict subset of the row-address signals.

20. An access method for writing to and reading from a memory array having memory cells arranged in rows and columns, the rows and columns connected to respective wordlines and data lines, each memory cell including a control terminal coupled to one of the wordlines and a data terminal selectively coupled to one of the data lines, the method comprising:
receiving an activate command specifying a row address of the memory cells;
decoding the row address to identify a strict subset of the data lines;
conveying data to or from the memory array via the strict subset of the data lines.

21. The method of claim 20, wherein at least one of the data lines is part of a defective data resource, and wherein the strict subset of the data lines excludes the defective data resource.

22. The method of claim 21, wherein excluding the defective data resource comprises disconnecting the data line that is part of the defective data resource in favor of an adjacent data line.

23. The method of claim 21, wherein the data lines are array data lines, and wherein excluding the defective data resource comprises disconnecting the array data line that is part of the defective data resource from a first column data line, disconnecting a second array data line from a second column data line, and connecting the second array data line to the first column data line.

24. The method of claim 20, wherein the data lines extend through regions of memory cells, each region including rows of memory cells, and wherein decoding the row address to identify the strict subset of the data lines comprises determining which of the regions contains the row corresponding to the row address, and retrieving a data line selection value corresponding to that region.

25. The method of claim 24, wherein at least two of the regions correspond to different data line selection values.

26. The method of claim 23, wherein the second array data line is adjacent the array data line that is part of the defective data resource.

* * * * *